(12) United States Patent
Nakai et al.

(10) Patent No.: US 8,314,348 B2
(45) Date of Patent: Nov. 20, 2012

(54) MULTILAYER PRINTED WIRING BOARD AND METHOD OF MANUFACTURING MULTILAYER PRINTED WIRING BOARD

(75) Inventors: Toru Nakai, Ibi-gun (JP); Sho Akai, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 602 days.

(21) Appl. No.: 12/333,398

(22) Filed: Dec. 12, 2008

(65) Prior Publication Data

US 2009/0218125 A1 Sep. 3, 2009

Related U.S. Application Data (60) Provisional application No. 61/033,201, filed on Mar. 3, 2008.

(51) Int. Cl.
*H05K 1/11* (2006.01)

(52) U.S. Cl. .................. 174/263; 174/264; 174/265

(58) Field of Classification Search .............. 174/264, 174/265, 263
See application file for complete search history.

(56) References Cited

U.S. PATENT DOCUMENTS

| | | | | |
|---|---|---|---|---|
| 2002/0112885 A1* | 8/2002 | Hotta et al. | ............ | 174/264 |
| 2003/0132025 A1* | 7/2003 | Wakihara et al. | ............ | 174/256 |
| 2007/0163112 A1 | 7/2007 | Wang | | |
| 2007/0273047 A1 | 11/2007 | Nakai et al. | | |

FOREIGN PATENT DOCUMENTS

| | | |
|---|---|---|
| CN | 101112141 A | 1/2008 |
| EP | 1 845 762 A1 | 10/2007 |
| JP | 9-116269 | 5/1997 |
| JP | 11-163517 | 6/1999 |
| JP | 2002-314247 | 10/2002 |
| JP | 2005-347391 | 12/2005 |
| JP | 2007-194265 | 8/2007 |
| JP | 2007-335539 | 12/2007 |

OTHER PUBLICATIONS

JP 2002-314247 English translation.*
English translation of JP2001-196746.*
U.S. Appl. No. 12/261,517, filed Oct. 30, 2008, Nakai.
U.S. Appl. No. 12/342,772, filed Dec. 23, 2008, Nakai, et al.

* cited by examiner

*Primary Examiner* — Tuan T Dinh
*Assistant Examiner* — Steven Sawyer
(74) *Attorney, Agent, or Firm* — Oblon, Spivak, McClelland, Maier & Neustadt, L.L.P.

(57) ABSTRACT

A multilayer printed wiring board includes a first interlaminar resin insulating layer, a first conductor circuit formed on the first interlaminar resin insulating layer, a second interlaminar resin insulating layer formed on the first interlaminar resin insulating layer and the first conductor circuit, a second conductor circuit formed on the second interlaminar resin insulating layer. A via conductor can be formed in the opening portion. The opening portion of the second interlaminar resin insulating layer can expose a face of the first conductor circuit. The via conductor connects the first conductor circuit and the second conductor circuit. The via conductor includes an electroless plating film formed on inner wall face of the opening portion and includes an electrolytic plating film formed on the electroless plating film and on the exposed face of the first conductor circuit exposed by the opening portion. The second conductor circuit includes the electroless plating film and the electrolytic plating film.

11 Claims, 5 Drawing Sheets

MULTILAYER PRINTED WIRING BOARD AND METHOD OF MANUFACTURING MULTILAYER PRINTED WIRING BOARD

CROSS-REFERENCE TO RELATED APPLICATIONS

The present application claims the benefits of priority to U.S. Application No. 61/033,201, filed Mar. 3, 2008. The contents of that application are incorporated herein by reference in their entirety.

BACKGROUND OF THE INVENTION

1. Field of the Invention

The present invention relates to a multilayer printed wiring board and a method of manufacturing a multilayer printed wiring board.

2. Discussion of the Background

As to multilayer printed wiring boards, an idea for a multilayer printed wiring board wherein conductor circuits and interlaminar resin insulating layers are alternately laminated on a resin substrate referred to as a core has been brought up. Additionally, a connection between conductor circuits via an interlaminar resin insulating layer of a multilayer printed wiring board is accomplished with via conductors. Such a multilayer printed wiring board can be manufactured with a method described below, for example.

Namely, the multi-layer printed wiring board can be manufactured with a copper-clad laminate board wherein a copper foil is bonded on both faces of a resin substrate as a starting material, and lower-layer conductor circuits are first formed on the resin substrate. Next, an interlaminar resin insulating layer is formed on the resin substrate on which the lower layer conductor circuits have been formed. Further, opening portions are formed in the interlaminar resin insulating layer such that the lower layer conductor circuits on the resin substrate are exposed.

Subsequently, an electroless plating film is formed on the interlaminar resin insulating layer and the exposed faces in the opening portions, and after a plating resist has been formed on this electroless plating film, a thickness is added by electroplating such that upper layer conductor circuits are formed on the interlaminar resin insulating layer by etching after the plating resist has been stripped. The lower layer conductor circuits on the resin substrate and the upper layer conductor circuits on the interlaminar resin insulating layer are connected with via conductors.

Further, following the formation of the interlaminar resin insulating layer and the upper layer conductor circuits having been repeated, a solder resist layer is formed at the end in order to protect the conductor circuits such that a multilayer printed wiring board can be manufactured by solder bumps being formed for the connection of electronic components such as an IC chip, a mother board, etc. An example multilayer printed wiring board is described in JP 2005-347391, the contents of this publication being incorporated herein by reference in their entirety.

SUMMARY OF THE INVENTION

An exemplary embodiment of a multilayer printed wiring board includes a first interlaminar resin insulating layer, a first conductor circuit, a second interlaminar resin insulating layer, a second conductor circuit, and a via conductor. The first conductor circuit is formed on the first interlaminar resin insulating layer. The second interlaminar resin insulating layer is formed on the first interlaminar resin insulating layer and the first conductor circuit. The second interlaminar resin insulating layer has an opening portion that exposes a face of the first conductor circuit. The second conductor circuit is formed on the second interlaminar resin insulating layer. The via conductor is formed in the opening portion and connects the first conductor circuit and the second conductor circuit. The via conductor includes an electroless plating film and an electrolytic plating film. The electroless plating film is formed on an inner wall face of the opening portion. The electrolytic plating film is formed on the electroless plating film and on the exposed face of the first conductor circuit exposed by the opening portion. The second conductor circuit includes the electroless plating film and the electrolytic plating film positioned on the electroless plating film.

An exemplary embodiment of a method of manufacturing a multilayer printed wiring board includes forming a first interlaminar resin insulating layer, forming a first conductor circuit, forming a second interlaminar resin insulating layer, forming, in the second interlaminar resin insulating layer, an opening portion, forming a second conductor circuit, and forming a via conductor. The first conductor circuit is formed on the first interlaminar resin insulating layer. The second interlaminar resin insulating layer is formed on the first interlaminar resin insulating layer and the first conductor circuit. The opening portion exposes a face of the first conductor circuit. The second conductor circuit is formed on the second interlaminar resin insulating layer. The via conductor is formed in the opening portion to connect the first conductor circuit and the second conductor circuit. The second conductor circuit includes an electroless plating film and an electroplating film on the electroless plating film. The via conductor includes the electroless plating film and the electroplating film. The electroless plating film is formed on an inner wall face of the opening portion. The electroplating film is formed on the electroless plating film and on the exposed face of the first conductor circuit exposed by the opening portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EXEMPLARY EMBODIMENTS

In a multilayer printed wiring board manufactured with a method such as described in the Background above, the connection between the lower layer conductor circuits and the upper layer conductor circuits is undertaken through via conductors comprised of an electroless plating film and an electroplating film on this electroless plating film. Accordingly, an electroless plating film constituting via conductors is present between the lower layer conductor circuits and the electroplating film constituting the via conductors.

Further, an electroplating film and a metal foil often constitute the lower layer conductor circuits. Accordingly, at the portions where a connection is made between the lower conductor circuits and the upper layer conductor circuits through via conductors there are formed different types of metal films. Specifically, to give an example, an electroless plating film could be formed on an electroplating film or an electroplating film could be formed on an electroless plating film. It is believed that when it comes to such different types of metal films, it is likely that the crystal state of each differs even if they are of the identical metal.

Further, if the diameters of the opening portions formed in the interlaminar resin insulating layer would be made smaller, it is believed that there would be occasions when a separation occurred between lower layer conductor circuits and an electroless plating film constituting via conductors and between the electroless plating film constituting via conductors and the electroplating film formed thereon following a heat cycle test.

The present inventors found, as a result of their diligent research, that the above-described problems could be addressed or solved by directly connecting an electroplating film constituting via conductors onto the exposed faces of conductor circuits, and completed a multilayer printed wiring board and a method of manufacture thereof in accordance with embodiments of the present invention.

Namely, an exemplary embodiment of a multilayer printed wiring board can include a first interlaminar resin insulating layer, a first conductor circuit formed on the first interlaminar resin insulating layer, a second interlaminar resin insulating layer formed on the first interlaminar resin insulating layer and the first conductor circuit and having an opening portion that exposes a face of the first conductor circuit, a second conductor circuit formed on the second interlaminar resin insulating layer, and a via conductor formed in the opening portion and configured to connect the first conductor circuit and the second conductor circuit. Additionally, the via conductor can comprise an electroless plating film formed on the inner wall face of the opening portion and an electrolytic plating film formed on the electroless plating film and on the exposed face of the first conductor circuit exposed by the opening portion. Further, the second conductor circuit can include the electroless plating film and the electrolytic plating film on the electroless plating film.

Where the first conductor circuit is connected to the via conductor without going through an electroless plating film as described above, the electric resistance between the two is low, providing an excellent electrical property (such as conductivity, for example).

And, as compared to the case as in a conventional multilayer printed wiring board wherein the constituents of a via conductor are an electroless plating film on the exposed face of a conductor circuit and an electroplating film thereon, in the wiring board described above, a separation between the conductor circuits and the via conductor is not susceptible to occurring, providing an excellent connection reliability between the conductor circuits and the via conductor. The electroplating film can be made of copper which has a low electrical resistance, and has excellent electrical properties.

The above-described electroless plating film can be made of nickel. This can allow the formation of fine conductor circuits having a small L/S ratio (line/space ratio) where the above-described electroplating film is copper and the above-described electroless plating film is nickel. The reason for this will be described below.

The multilayer printed wiring board can further include an insulating substrate on which the first interlaminar resin insulating layer is formed. The insulating substrate can include a through-hole. A through-hole conductor can be positioned within the through-hole to electrically connect a first side of the multilayer printed wiring board with a second side of the multilayer printed wiring board. Additionally, a resin filler layer can be included inside of the through-hole conductor.

The multilayer printed wiring board can also further include a solder resist layer formed on the second interlaminar resin insulating layer. Additionally, a solder pad can be positioned on the second conductor circuit. A solder bump can be formed on the solder pad and extend outwardly from the solder resist layer.

A method of manufacturing a multilayer printed wiring board can include forming a first interlaminar resin insulating layer, forming a first conductor circuit on the first interlaminar resin insulating layer, forming a second interlaminar resin insulating layer on the first interlaminar resin insulating layer and the first conductor circuit, forming, in the second interlaminar resin insulating layer, an opening portion that exposes the first conductor circuit, forming a second conductor circuit on the second interlaminar resin insulating layer, and forming a via conductor in the opening portion to connect the first conductor circuit and the second conductor circuit. The second conductor circuit can comprise an electroless plating film and an electroplating film on the electroless plating film. Additionally, the via conductor can comprise the electroless plating film formed on the inner wall face of the opening portion and the electroplating film formed on the electroless plating film and on the exposed face of the first conductor circuit exposed by the opening portion.

Where an electroplating film is directly formed on the exposed face of the first conductive circuit, the first conductive circuit and the via conductor are connected without going through an electroless plating film. Thus, a multilayer printed wiring board manufactured in accordance with this exemplary method can provide a low electrical resistance between the first conductive circuit and the via conductor and the board has an excellent electrical property.

Additionally, as compared to a conventional multilayer printed wiring board wherein a via conductor is composed of an electroless plating film on the exposed face of a conductor circuit and an electroplating film thereon, a separation between the conductor circuits and the via conductor is not susceptible to occurring in the wiring board manufactured according to the present method, providing an excellent connection reliability between the conductor circuits and the via conductor.

The above-described forming the second conductor circuit and forming the via conductor can be carried out concurrently. Thus, the second conductor circuit and via conductor can be efficiently formed. And, the concurrent formation of the two results in being less susceptible to the occurrence of a defective connection between the two.

Further, the forming the second conductor circuit and forming the via conductor can include forming the above-described electroless plating film on the surface of the above-described second interlaminar resin insulating layer and the inner wall face of the above-described opening portion and forming the above-described electroplating film on the above-described electroless plating film and on the exposed face of the above-described first conductor circuit. Thus, an electroplating film constituting the via conductor can be directly formed on the first conductor circuit.

Additionally, an electroplating film formed on the exposed face of the above-described first conductor circuit can be formed with the above-described first conductor circuit as a seed layer. Accordingly, an electroplating film can be formed with certainty on the exposed face of the above-described first conductor circuit since the electroplating film is formed with the first conductor circuit as a seed layer.

The above-described forming the second conductor circuit and forming the via conductor can include forming a plating resist on the above-described electroless plating film after the above-described electroless plating film having been formed, forming an electroplating film on the electroless plating film on the area where the above-described plating resist is not formed and on the exposed face of the above-described first conductor circuit, stripping the above-described plating resist, and removing the electroless plating film exposed by the above-described plating resist having been stripped. Accordingly, a printed wiring board with a fine conductor circuit formation and a high via-connection reliability can be manufactured.

The above-described electroless plating film can be removed by etching with an etchant. Accordingly, an unnecessary electroless plating film can be removed with certainty. Additionally, the above-described electroplating film can be substantially not etched with the above-described etchant. This arrangement is particularly suitable for the formation of fine conductor circuits since the above-described electroplating film is substantially not etched with the above-described etchant.

The above-described electroless plating film can be comprised of nickel and the above-described electroplating film can be comprised of copper. Thus, it is easy for an electroplating film to be not substantially etched and for an electroless plating film to be selectively etched in this embodiment.

The method of manufacturing a multilayer printed wiring board can further include forming an insulating substrate on which the first interlaminar resin insulating layer is formed. The insulating substrate can include a through-hole. Additionally, a through-hole conductor can be positioned within the through-hole. The through-hole conductor can electrically connect a first side of the multilayer printed wiring board with a second side of the multilayer printed wiring board The method of manufacturing a multilayer printed wiring board can also further include forming a solder resist layer on the second interlaminar resin insulating layer. The method can also include forming a solder pad on the second conductor circuit and forming a solder bump on the solder pad. Additionally, the solder bump can extend outwardly from the solder resist layer The exemplary embodiments will now be described with reference to the accompanying drawings. Accordingly, a multilayer printed wiring board and a method of manufacturing a multilayer printed wiring board pertaining to an exemplary embodiment will be described.

Figure 1A:
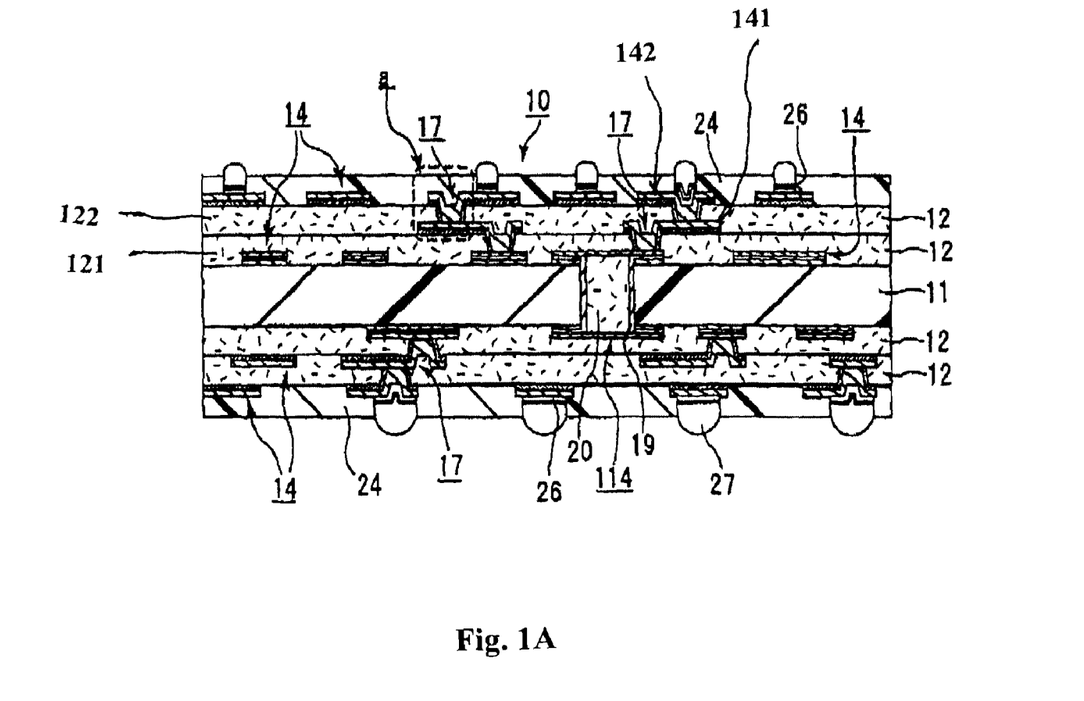
FIG. 1A is a sectional view illustrating an exemplary multilayer printed wiring board.
Figure 1B:
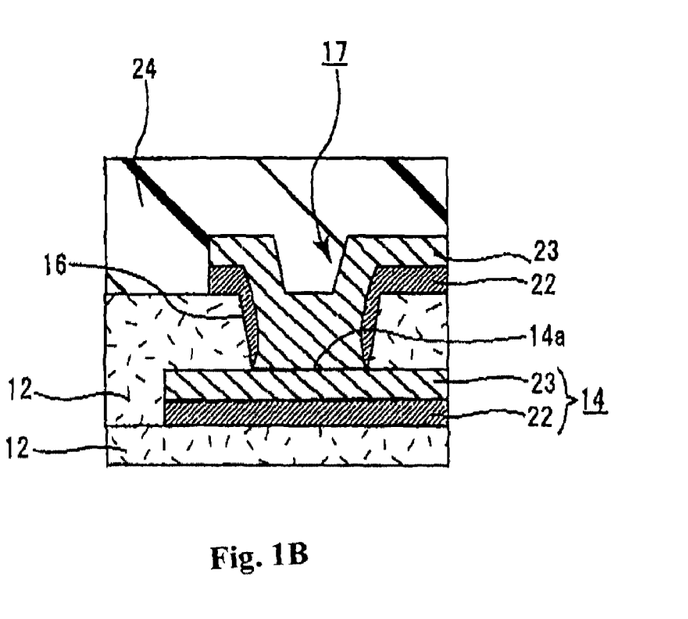
FIG. 1B is a partially enlarged sectional view illustrating region a of the multilayer printed wiring board illustrated in FIG. 1A.

FIG. 1A is a sectional view illustrating a multilayer printed wiring board pertaining to an exemplary embodiment, and FIG. 1B is a partial enlargement sectional view illustrating region a of the multilayer printed wiring board illustrated in FIG. 1A.

As to the multilayer printed wiring board 10 in accordance with the embodiment illustrated in FIG. 1, conductor circuits 14 and an interlaminar resin insulating layer 12 are formed on both faces of the insulating substrate 11, and an electrical connection is made between the conductor circuits 14 sandwiching the insulating substrate 11 with through-hole conductors 19. Here, the upper faces of the conductor circuits 14 are comprised of an electrolytic copper plating film.

An electrical connection can be made between the conductor circuits 14 sandwiching the interlaminar resin insulating layer 12 through via conductors 17. Further, a resin filler 20 is filled inside the through-hole conductors 19. Additionally, conductor circuits 114 can cover the filler 20. As the outermost layer, a solder resist layer 24 can be formed, and solder bumps 27 can be formed on the outermost layer conductor circuits 14 via solder pads 26.

As illustrated in FIG. 1B, the conductor circuits (the first conductor circuits) 14 on the interlaminar resin insulating layer 12 can be comprised of an electroless copper plating film 22 and an electrolytic copper plating film 23 on the electroless copper plating film 22, and via conductors 17 are formed thereon. Regarding the via conductors 17, the portions in contact with the inner wall faces of opening portions 16 formed in the interlaminar resin insulating layer 12 are comprised of the electroless copper plating film 22, and the other portions are an electrolytic copper plating film 23.

Therefore, on the upper faces (the exposed faces exposed by the opening portions 16) 14a of the conductor circuits 14, there is formed an electrolytic copper plating film of the via-conductors 17. Namely, the electroplating film of the via conductors 17 is directly formed on the conductor circuits 14. Therefore, the electrolytic copper plating film 23 of the conductor circuits 14 and the electrolytic copper plating film of the via conductors 17 are directly connected. Accordingly, the conductor circuits 14 and the via conductors 17 are connected with an electrolytic copper plating film 23 to another electrolytic copper plating film 23.

As such, the electrolytic copper plating film 23 is formed on the conductor circuits 14 (the first conductor circuits) without going through the electroless copper plating film 22 constituting a portion of the via conductors 17. Accordingly, this formation results in the electrical resistance between the first conductor circuits and the via conductors becoming low and having an excellent electrical property.

Additionally, since the electrolytic copper plating film 23 constituting the via conductors 17 is formed on the exposed faces 14a (the faces exposed by the opening portions formed in the interlaminar resin insulating layer) of the conductor circuits 14 (the first conductor circuits), the electrolytic copper plating film 23 is not susceptible to the occurrence of the separation between the conductor circuits 14 (the first conductor circuits) and the via conductors 17. Accordingly, in this embodiment the connection reliability between the conductor circuits and the via conductors is enhanced.

Further, since the conductor circuits 14 and the via conductors 17 are connected with the electrolytic copper plating film 23 to the electrolytic copper plating film 23 in this embodiment, the connection strength between the two is excellent. Here, since copper is low in electrical resistance, an electroplating film is preferably comprised of copper.

Next, an exemplary embodiment of a method of manufacturing a multilayer printed wiring board will be described in the order of steps.

(1) With an insulating substrate as a starting material, conductor circuits are first formed on said insulating substrate.

As to the above-described insulating substrate, it is not particularly limited, and a resin substrate such as, to give examples, a glass epoxy substrate, a bismaleimide triazine (BT) resin substrate, a copper-clad laminate board, and an RCC substrate, a ceramic substrate such as an aluminum nitride substrate, a silicone substrate, etc., may be utilized.

The above-described conductor circuits may be formed, after the surface of the above-described insulating substrate having been electroless-copper-plated and successively electrolytic-copper-plated to form a plane conductor layer of copper, by etching, for example.

The formation of such an electrolytic copper plating film means the upper faces of the conductor circuits formed on the above-described insulating substrate are comprised of an electrolytic copper plating film. Accordingly, the conductor circuits and the via conductors are connected with an electrolytic copper plating film to an electrolytic copper plating film when the via conductors are formed and undergo electrolytic copper plating during a subsequent step, resulting in an excellent electrical property between the two.

Through-hole conductors may be formed to make a connection between the conductor circuits sandwiching the above-described insulating substrate. Additionally, the surfaces of the conductor circuits may be roughened with etching, etc., as necessary, following the formation of the conductor circuits.

(2) Next, on the insulating substrate on which a conductor circuit has been formed, there is formed an interlaminar resin insulting layer and there are formed in this interlaminar resin insulating layer opening portions reaching the conductor circuits (the first conductor circuits) on the above-described insulating substrate.

The above-described interlaminar resin insulating layer may be formed with a thermosetting resin, a photosensitive resin, a resin wherein a photosensitive group is added into a portion of a thermosetting resin, or a resin complex containing these and a thermosetting resin, etc. Specifically, a resin layer is formed by first coating an unhardened resin with a roll coater, a curtain coater, etc., or a resin film being thermo-compression bonded. Then, the resin layer is hardened and the above-described opening portions are formed as the resin layer is processed with a laser and exposure and development to form an interlaminar resin insulating layer having the above-described opening portions.

Additionally, a resin layer comprised of the above-described thermoplastic resin can be formed by a resin molded material molded in a film shape being thermo-compression-bonded.

(3) Next, on the surface of the above-described interlaminar resin insulating layer (including the wall faces of the above-described opening portions) there is formed an electroless copper plating film.

At this juncture, an electroless copper plating film is not formed on the exposed faces exposed by the above-described openings of the conductor circuits on the above-described insulating substrate.

Specifically, a palladium catalyst is first applied such that the above-described palladium catalyst is adhered to the surface of the above-described interlaminar resin insulating layer (including the wall faces of the above-described opening portions) and the above-described palladium catalyst is not adhered to the exposed faces of the above-described conductor circuits. Then, an electroless copper plating not having autocatalytic property with respect to copper is carried out to form an electroless copper plated film only on the predetermined portions.

As for a method for selectively adhering the above-described palladium catalyst to the surface of the above-described interlaminar resin insulating layer (including the wall faces of the above-described opening portions), a method described in the following may be used.

(a) First, a palladium complex is adhered to the exposed faces of the above-described conductor circuits (copper) and the surface of the above-described interlaminar resin insulating layer (including the wall faces of the above-described opening portions).

(b) Next, the surfaces of the exposed portions of the conductor circuits (copper) are dissolved by etching with a copper chloride etchant. This removes palladium complex off of the exposed faces of the conductor circuits. Palladium complex on the above-described interlaminar resin insulating layer (including the wall faces of the above-described opening portions) remains adhered.

(c) Then, the palladium complex is immersed in a palladium reducing agent solution to reduce palladium complex back into palladium metal.

Further, palladium catalyst may selectively be adhered with a method described in the following.

Namely, (a) first, a copper oxide (CuO) film is formed on the exposed faces of the above-described conductor circuits comprised of copper with the use of an oxidizing agent such as an $H_2O_2$ aqueous solution or an $NaClO_3$ aqueous solution.

(b) Next, palladium catalyst is adhered to the surface of the above-described interlaminar resin insulating layer (including the wall faces of the above-described opening portions) and the exposed faces of the above-described conductor circuits.

(c) Then, the above-described copper oxide film is dissolved and removed with the use of an acid such as dilute sulfuric acid. Thus, along with the dissolution and removal of the copper oxide film, palladium catalyst adhered to the above-described copper oxide film is concurrently removed.

The undertaking of the treatment described above allows palladium catalyst to selectively adhere to the surface of the above-described interlaminar resin insulating layer (including the wall faces of the above-described opening portions).

Following the palladium catalyst having selectively been adhered with these methods, the substrate on which the palladium catalyst is formed is immersed in an electroless plating solution containing a reducing agent not having the autocatalytic property with respect to copper (hypophosphorous acid, for example). This forms an electroless plating film on the surface of the interlaminar resin insulating layer (including the wall faces of the above-described opening portions), and does not form an electroless plating film on the exposed faces exposed by the opening portions of the conductor circuits.

The above-described electroless copper plating film is preferably 0.1 to 0.3 μm in thickness. Additionally, the surface of the interlaminar resin insulating layer may be pre-roughened prior to the formation of the above-described electroless copper plating film.

(4) Next, a plating resist is formed on the above-described electroless copper plating film.

The above-described plating resist is formed on the portions where conductor circuits and via conductors are not formed. The method of forming the above-described plating resist is not particularly limited, and it may be formed by being exposed and developed after a photosensitive dry film has been bonded.

(5) Next, an electrolytic copper plating film is formed on the portions where the plating resist is not formed on the above-described electroless copper plating film and on the exposed faces of the above-described conductor circuits. On account of step (3) described above, the electroless copper plating film is not formed on the exposed faces of the first conductor circuits. Accordingly, by carrying out step (5), the first conductor circuits and the via conductors are connected without going through the electroless copper plating film. Thus, an electroplating film constituting via conductors is directly formed on an electroplating film constituting the first conductor circuits.

The above-described electrolytic copper plating film may be formed with a method which has been known to the public. Further, the above-described electrolytic copper plating film is preferably 5 to 20 μm in thickness. In addition, during this step the above-described electroless copper plating film and the exposed faces of the above-described conductor circuits function as seed layers in electroplating. As such, since the electroplating film is formed with the first conductor circuits as seed layers, an electroplating film can be formed with certainty on the exposed faces of the first conductor circuits.

(6) Then, the plating resist on the above-described interlaminar resin insulating layer is stripped. The above-described plating resist can be stripped with an alkali aqueous solution, etc., for example.

(7) Next, the electroless copper plating film exposed by the above-described plating resist having been stripped is removed. Manufacturing methods such as this allow printed wiring boards with the formation of fine conductor circuits and with a high via conductor reliability to be manufactured.

The above-described electroless copper plating film can be removed with the use of an etchant, for example. The etching with the use of an etchant removes with certainty an unnecessary electroless copper plating film (an electroless copper plating film present between electroplating films).

By such steps as (3) through (7) being carried out, conductor circuits (the first conductor circuits) are formed on the interlaminar resin insulating layer, and at the same time via conductors connecting these conductor circuits and the conductor circuits on the insulating substrate can be formed. Accordingly, the conductor circuits (the first conductor circuits, one of which is shown in FIG. 1A as reference numeral 141) and via conductors can efficiently be formed. As a result, a defective connection between the first conductor circuits and the via conductors is less likely to occur. Further, the connection between the conductor circuits on the insulating substrate and the via conductors is a connection between the electrolytic copper plating films.

In addition, in the above-described steps (1) through (7), the insulating substrate corresponds to a first interlaminar resin insulating layer shown as reference numeral 121 in FIG. 1A.

The catalyst on the interlaminar resin insulating layer may be removed with an acid or an oxidizer as necessary following the formation of the above-described conductor circuits. Thus, the electrical property can be prevented from declining.

(8) Further, an interlaminar resin insulating layer and conductor circuits may further be formed and concurrently via conductors may be formed by repeating the above-described steps (2) through (7) as necessary. In addition, when this step (8) is undertaken, the interlaminar resin insulating layer formed under step (2) corresponds to the first interlaminar resin insulating layer, and the interlaminar resin insulating layer formed under step (8) corresponds to the second interlaminar resin insulating layer shown as reference numeral 122 in FIG. 1A.

Further, the conductor circuits formed under step (8) correspond to the second conductor circuits (one of which is shown in FIG. 1A as 142). Similar to the first conductor circuits described above, the second conductor circuits are formed on the second interlaminar resin insulating layer, and at the same time via conductors connecting these second conductor circuits and the first conductor circuits on the first insulating substrate can be formed. Accordingly, the second conductor circuits and via conductors can also be efficiently formed. As a result, a defective connection between the second conductor circuits and the via conductors is less likely to occur. Further, the connection between the second conductor circuits and the via conductors is also a connection between the electrolytic copper plating films.

(9) Lastly, a solder resist layer and solder bumps are formed to complete a multilayer printed wiring board. Specifically, on the interlaminar resin insulating layer including the uppermost conductor circuits there is coated a solder resist composition with a roll coater, etc., on which an opening treatment is carried out with laser treatment, exposure and development, etc., and a solder resist layer is formed by a hardening treatment, etc., being carried out. Then, solder bumps are formed in the opening portions of the solder resist layer to finish the manufacture of a printed wiring board.

The following is the listing of the actions and effects of a multilayer printed wiring board and a method of manufacturing a multilayer printed wiring board pertaining to an exemplary embodiment.

In a multilayer printed wiring board, since the connection portions between the conductor circuits and the via conductors connected to the conductor circuits are comprised of an electrolytic copper plating film, the continuity of the crystal lattice between the two is high. As a result thereof, since the connection strength between the conductor circuits and the via conductors is high, the above-described multilayer printed wiring board is excellent in connection reliability, and, in particular, connection reliability following a temperature cycle test is high.

In this multilayer printed wiring board, since the conductor circuits (the first conductor circuits) and the via conductors are such that they are connected with an electrolytic copper plating film to another electrolytic copper plating film without going through an electroless copper plating film, the electrical resistance between the two is low. Therefore, the multilayer printed wiring board has an excellent electrical resistance.

An exemplary embodiment will be described in the following in more details as examples are being provided, but the embodiments in accordance with the present invention are not limited to only these examples.

EXAMPLE 1

A. Preparation of Resin Filler 100 parts by weight of bisphenol F-type epoxy monomer (made by Yuka Shell KK, molecular weight: 310, YL983U), 170 parts by weight of $SiO_2$ spheroidal particulates (made by Adotech, CRS 1101-CE) the surface of which has been coated with a silane coupling agent with the average particulate diameter being 1.6 μm and the diameter of the maximum particulate being no greater than 15 μm, and 1.5 parts by weight of a leveling agent (made by Sun Nopco Co., Ltd, Perenol S4) were placed in a container, which was stirred and mixed to prepare a resin filler with the viscosity being 45 to 49 Pa·s at 23±1° C. In addition, an imidazole curing agent (made by Shikoku Chemicals Corp., 2E4MZ-CN) in 6.5 parts by weight was used as a curing agent.

Figure 2A:
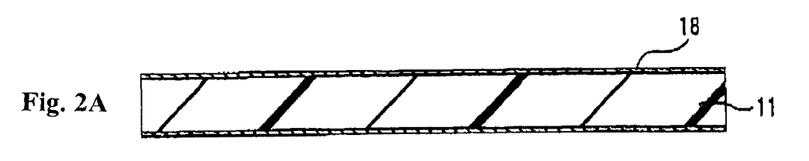
FIG. 2A through FIG. 2G are sectional views illustrating a portion of the manufacturing process in accordance with an exemplary method of manufacturing a multilayer printed wiring board.
Figure 2B:
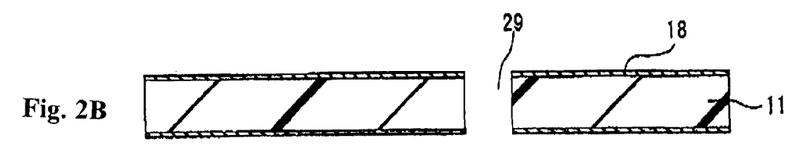

B. Manufacture of Multilayer Printed Wiring Board (1) The starting material was a copper-clad laminate board wherein on both faces of an insulating substrate 11 comprised of a 0.8 mm-thick glass epoxy resin there is laminated an 18 μm copper foil 18, as illustrated in FIG. 2A. Next, as illustrated in FIG. 2B, holes were drilled in this copper-clad laminate board such that through holes 29 for through-hole conductors were formed.

Figure 2C:
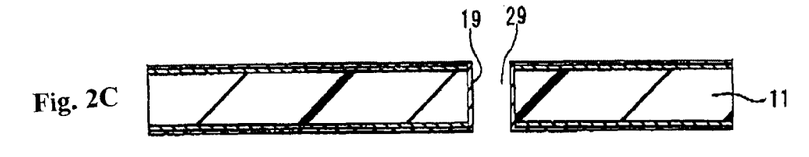

Next, as illustrated in FIG. 2C, the copper foils 18 and the inner wall surfaces of the through holes 29 were subjected to electroless copper-plating and electrolytic copper-plating such that conductor layers including through-hole conductors 19 comprised of the electroless copper plating film and the electrolytic copper plating film were formed.

(2) Next, after the substrate in which through-hole conductors 19 had been formed was washed in water and dried, it underwent a blacking process with an aqueous solution containing NaOH (10 g/l), NaClO$_2$ (40 g/l), and Na$_3$PO$_4$ (6 g/l) as a blacking bath (an oxidation bath) and a reduction process with an aqueous solution containing NaOH (10 g/l) and NaBH4 (6 g/l) as a reduction bath to form roughened faces (not illustrated) out of the surfaces of the through-hole conductors 19.

Figure 2D:
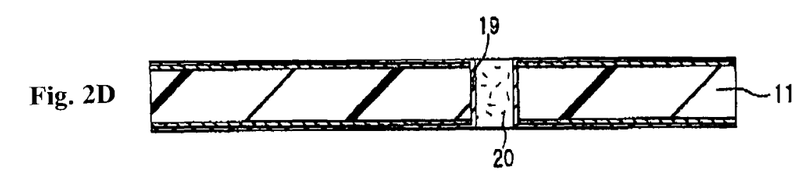

(3) Next, as illustrated in FIG. 2D, the through-hole conductors 19 were filled in with the resin filler described under A described above with the method described below.

Namely, after the resin filler had first been squeezed into the through-hole conductors with the use of a squeegee, it was dried under conditions at 100° C. for 20 minutes. Subsequently, one face of the substrate was sanded by belt-sander grinding using a #600 belt-sanding sandpaper (made by Sankyo Rikagaku Co., Ltd.) such that the resin filler 20 does not remain on the electrolytic copper plating film, which was next buffed to remove any marring due to the above-described belt-sander grinding. A series of grinding as such was likewise performed on the other face of the substrate as well. Next, it was heated at 100° C. for one hour, at 120° C. for three hours, at 150° C. for one hour, and at 180° C. for seven hours to form resin filler layers 20.

Figure 2E:
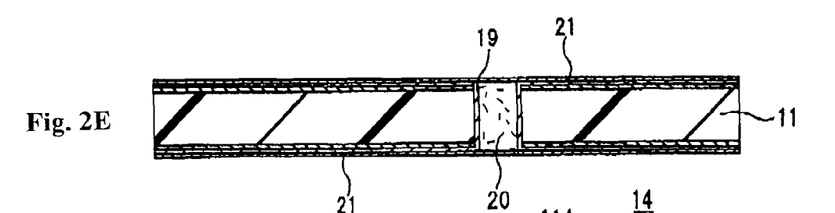
Figure 2F:
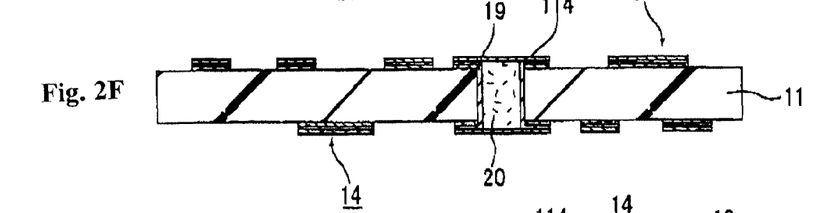

(4) Next, as illustrated in FIG. 2E, a conductor layer 21 comprised of an electroless copper plating film and an electrolytic copper plating film was formed on the electrolytic copper plating film and the resin filler 20. Continuing on, as illustrated in FIG. 2F, conductor circuits 14 were formed on the insulating substrate 11 with a subtractive method. At that time, conductor circuits 114 concurrently covering the resin filler 20 were also formed.

(5) Next, the above-described substrate was, after having been washed in water and acid-degreased, was soft-etched, and, subsequently, the entirety of the surface (including the land surface of the through-hole conductors 19) of the conductor circuits 14 was roughened (not illustrated) by the surfaces of the conductor circuits 14 (including the conductor circuits 114 covering the resin filler 20) being etched with an etchant being sprayed on both faces of the substrate with a sprayer. As for the etchant, an etchant containing 10 parts by weight of imidazole-copper (II) complex, 7 parts by weight of glycolic acid, and 5 parts by weight of potassium chloride (made by Mech Corporation Mech Etch Bond) was used.

Figure 2G:
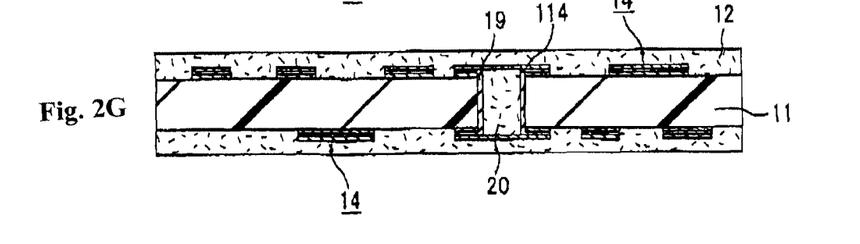

(6) Next, as illustrated in FIG. 2G, an interlaminar resin insulating layer 12 was formed on the insulating substrate 11 and the conductor circuits 14 with the use of a film for interlaminar resin insulating layer formation (made by Ajinomoto Co., Inc., ABF). Namely, a film for interlaminar resin insulating layer formation was laminated on the substrate under the conditions of a vacuum of 65 Pa, a pressure of 0.4 MPa, the temperature at 80° C., and for a time of 60 seconds, which was then thermoset at 170° C. for 30 minutes.

Figure 3A:
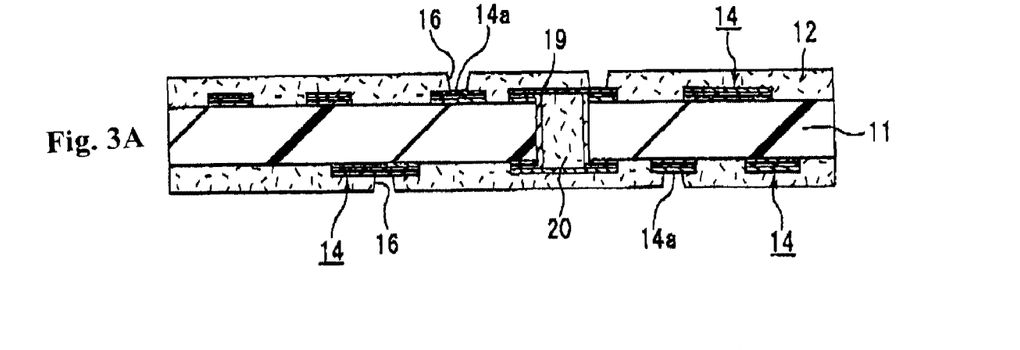
FIG. 3A through FIG. 3D are sectional views illustrating a portion of the manufacturing process in accordance with the method of manufacturing a multilayer printed wiring board.

(7) Next, as illustrated in FIG. 3A, opening portions 16 having a diameter of 80 μm were formed in the interlaminar resin insulating layer 12 with the CO$_2$ gas laser. As a result, a portion of the upper face (the exposed face 14a) of each of the conductor circuits 14 was exposed by the opening portion 16.

(8) Next, the substrate in which the opening portions 16 were formed was immersed in an 80° C. solution containing 60 g/l of permanganic acid for 10 minutes such that the surface of the interlaminar resin insulating layer 12 including the inner wall faces of the opening portions 16 was roughened (not illustrated).

(9) Next, the substrate which had been subjected to the above-treatment was immersed in a neutralization solution (made by Shipray Co.) and then washed in water.

(10) Next, a palladium catalyst (not illustrated) was applied to the surface of the interlaminar resin insulating layer 12 (including the inner wall faces of the opening portions 16). Specifically, the above-described substrate was subjected to treatments in the order of alkaline degreasing (HCF-45, made by Atotech Corp.), washing in warm water, washing in water, acid degreasing (HCF-45, made by Atotech Corp.), washing in warm water, washing in water, 10 VOL % sulfuric acid treatment, washing in water, predip (Predip Neoganth, made by Atotech Corp.), complex adhesion (Activator Neoganth 834 conc, made by Atotech Corp.), and washing in water such that palladium complex was adhered to the entirety of the surface. Then, it was immersed in a copper chloride etchant (copper chloride, hydrochloric acid) such that palladium complex was removed off the exposed faces 14a of the conductor circuits exposed by the opening portions 16. Then, the palladium complex adhered to the surface of the interlaminar resin insulating layer 12 (including the inner wall faces of the opening portions 16) was reduced to metal palladium by the activation treatment (Reducer Neoganth WA).

Figure 3B:
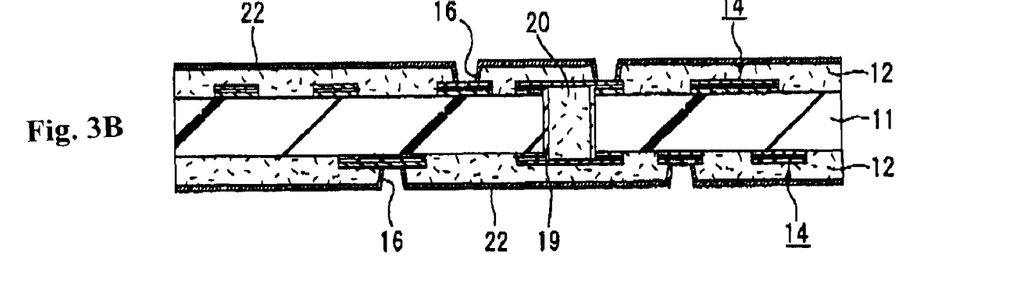

(11) Next, as illustrated in FIG. 3B, the substrate to which the above-described palladium catalyst is adhered is immersed in an electroless copper plating aqueous solution having sodium hypophosphite as a reducer (MF-390, made by Nippon MacDermid Co., Inc., Ltd.) such that a 0.1 to 0.3 μm-thick electroless copper plating film 22 was formed on the surface of the interlaminar resin insulating layer 12 (including the inner wall faces of the opening portions 16).

In addition, in this embodiment, an electroless copper plating film was not formed on the exposed faces 14a of the conductor circuits. This is because, besides palladium catalyst not being present on the exposed faces 14a, the electroless copper plating solution with sodium hypophosphite as a reducer does not possess a catalytic activity with respect to copper.

Electroless Copper Plating Conditions:
4 minutes at the solution temperature of 75° C.

Figure 3C:
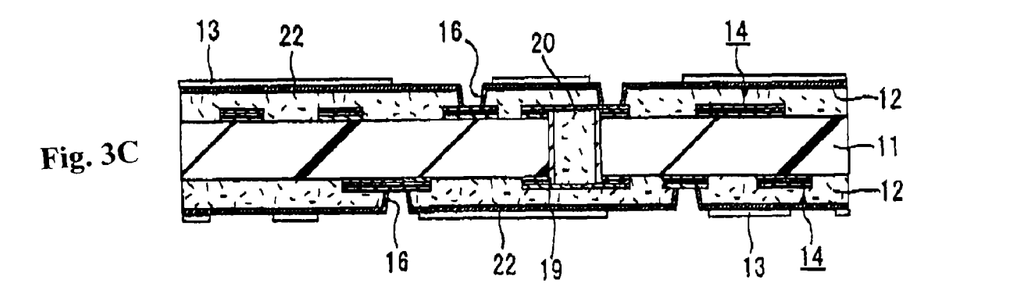

(12) Next, as illustrated in FIG. 3C, a commercially available photosensitive dry film was bonded on the electroless copper plating film 22, which was exposed and developed with a mask having been placed such that a 25 μm-thick plating resist 13 was provided.

Figure 3D:
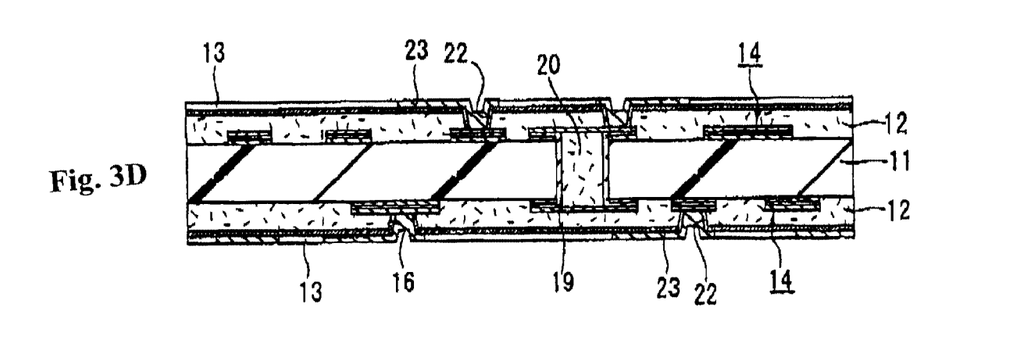

(13) Next, as illustrated in FIG. 3D, the substrate on which a plating resist 13 has been formed was washed in 50° C. water and degreased, and after having been washed in 25° C. water and further in sulfuric acid, it was electroplated under the following conditions such that a 25 μm-thick electrolytic copper plating film 23 was formed on the portion where a plating resist 13 was not formed.

Electrolytic Copper Plating Solution:

| | |
|---|---|
| Sulfuric acid | 150 g/L |
| Copper sulfide | 150 g/L |
| Chlorine ion | 8 mg/L |
| Additives | 4 ml/L (made by Okuno Chemical Industries Co. Ltd., |
| | i. Top Lucina NSV-1) |
| | ii. 0.5 ml/L (made by Okuno Chemical Industries Co. Ltd., Top Lucina NSV-2) |

-continued iii. 1 ml/L (made by Okuno Chemical Industries Co. Ltd., Top Lucina NSV-3).

Electroplating Conditions:

| Electro current density | 1 A/dm² |
|---|---|
| Time | 90 minutes |
| Temperature | 23° C.. |

Figure 4A:
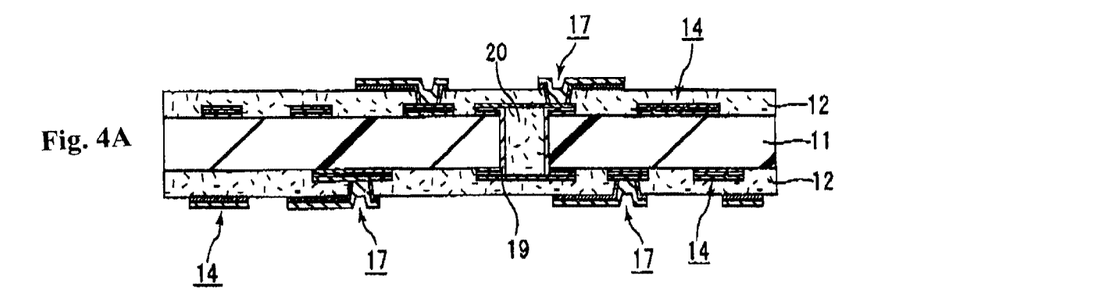
FIG. 4A through FIG. 4D are sectional views illustrating a portion of the manufacturing process in accordance with the method of manufacturing a multilayer printed wiring board.

(14) Next, the plating resist 13 was stripped and removed. Continuing on, the electroless copper plating film 22 between the adjacent electrolytic copper plating films was dissolved and removed with etching with a mixture solution of sulfuric acid and hydrogen peroxide. This formed 18 μm-thick conductor circuits 14 comprised of the electroless copper plating film 22 and the electrolytic copper plating film 23 on the electroless copper plating film and via conductors 17 comprised mainly of the electrolytic copper plating film 23 (refer to FIG. 4A).

As described above, since no electroless copper plating film is formed on the exposed faces of the conductor circuits when it comes to Example 1, the via conductors 17 have the structure illustrated in FIG. 1B. Namely, the exposed faces 14a are comprised of the electrolytic copper plating film of the first conductor circuits and the electrolytic copper plating film of the via conductors 17 is formed on this electrolytic copper plating film. Further, on the inner wall faces in the opening portions of the interlaminar resin insulating layer 12, an electroless copper plating film is formed and an electrolytic copper plating film is formed on that electroless copper plating film. In addition, in the example, the minimum value of the L/S ratio (line/space ratio) of the conductor circuits 14 was set to be 10 μm/10 μm.

Figure 4B:
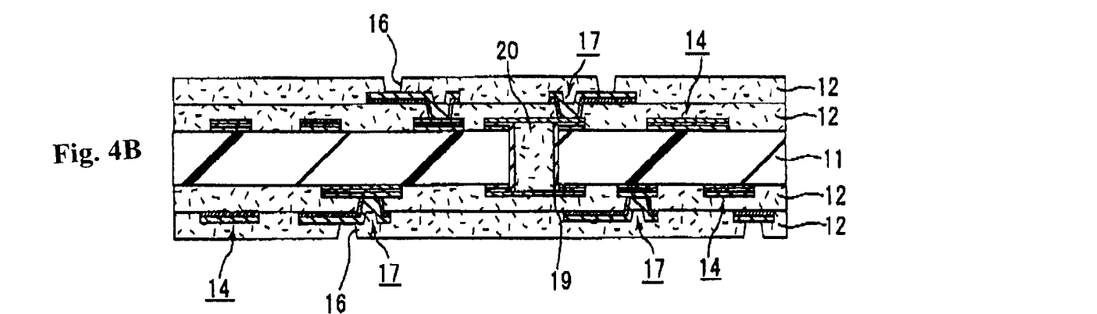
Figure 4C:
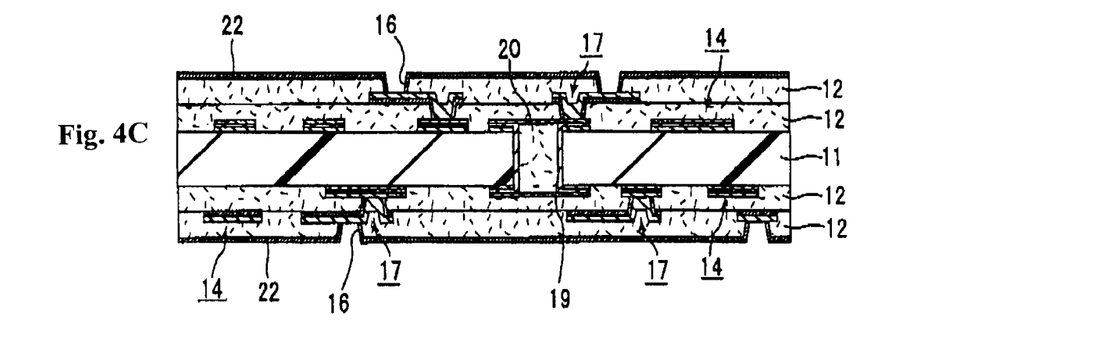
Figure 4D:
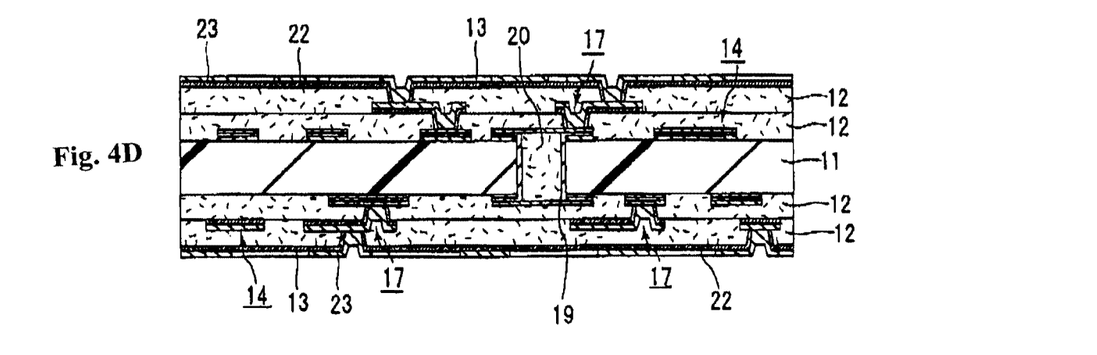

(15) Further, with the use of an etchant similar to the etchant used during step (5) described above, the surfaces of the conductor circuits 14 and the via conductors were roughened (not illustrated). Next, likewise as with steps (6) through (8) described above, an interlaminar resin insulating layer 12 having opening portions 16 and the surface of which had been roughened (not illustrated) was formed (refer to FIG. 4B).

(16) Next, with a method similar to the method under steps (9) through (14) described above, conductor circuits 14 and via conductors 17 were formed (refer to FIG. 4C through FIG. 5A).

Figure 5A:
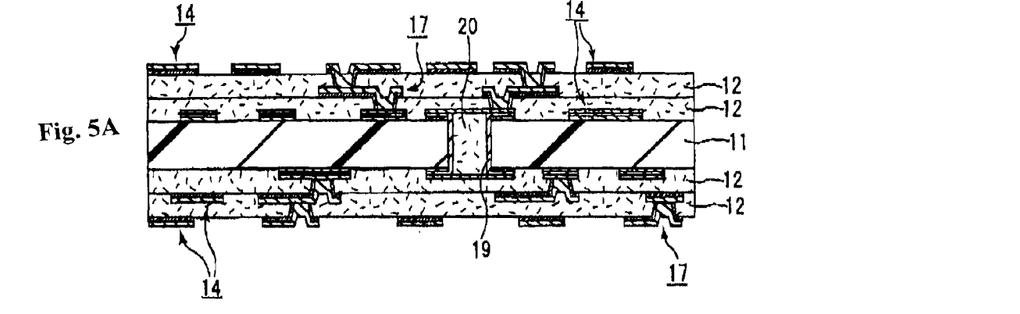
FIG. 5A through FIG. 5D are sectional views illustrating a portion of the manufacturing process in accordance with the method of manufacturing a multilayer printed wiring board.
Figure 5B:
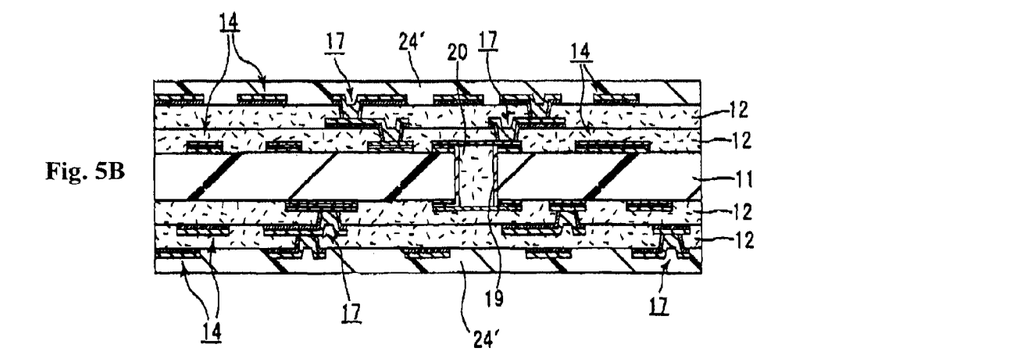

(17) Next, as illustrated in FIG. 5B, a commercially available solder resist composition was coated in 30 μm in thickness on the outermost layer interlaminar resin insulating layer 12 and the conductor circuit 14, which was dried at 70° C. for 20 minutes and at 70° C. for 30 minutes such that a commercially available solder resist layer 24' was formed.

Figure 5C:
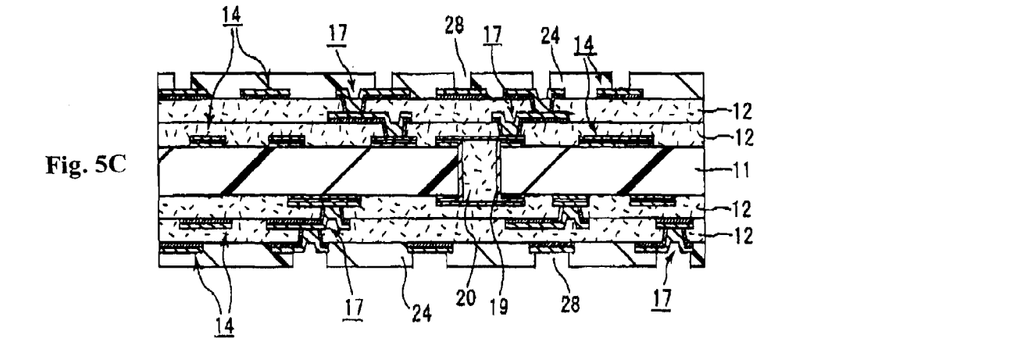

(18) Next, as illustrated in FIG. 5C, a 5 mm-thick photomask, on which a pattern for openings for solder bump formation was contact-adhered to the solder resist composition layer 24' and exposed with an ultraviolet ray of 1,000 mJ/cm², was developed with the DMTG solution such that openings for solder bump formation 28 were formed.

Further, the solder resist composition layer 24 was subjected to heating at 80° C. for one hour, at 100° C. for one hour, at 120° C. for one hour, and at 150° C. for three hours such that the solder resist composition layer 24' became hardened to form a solder resist layer 24 (20 μm in thickness) having openings for solder bump formation 28.

(19) Next, the substrate on which the solder resist layer 24 was formed was immersed in an electroless nickel plating solution containing nickel chloride ($2.3 \times 10^{-1}$ mol/l), sodium hypophosphite ($2.8 \times 10^{-1}$ mol/l), and sodium citrate ($1.6 \times 10^{-1}$ mol/l) with pH=4.5 for 20 minutes such that a 5 μm-thick nickel plating layer was formed in the openings for solder bump formation 28. Further, that substrate was immersed in an electroless gold plating solution containing potassium gold cyanide ($7.6 \times 10^{-3}$ mol/l), ammonium chloride ($1.9 \times 10^{-1}$ mol/l), sodium citrate ($1.2 \times 10^{-1}$ mol/l), and sodium hypophosphite ($1.7 \times 10^{-1}$ mol/l) at 80° C. for 7.5 minutes such that a 0.03 μm-thick gold plating layer was formed on the nickel layer providing solder pads 26.

Figure 5D:
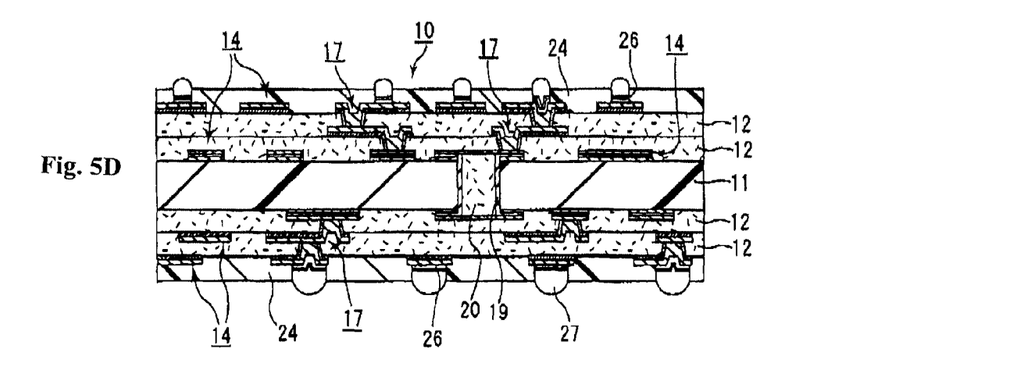

(20) Next, a solder paste was printed on the openings for solder bump formation 28 formed in the solder resist layer 24 such that solder bumps 27 were formed by reflow at 200° C., completing a multilayer printed wiring board 10 (refer to FIG. 5D).

A multilayer printed wiring board in accordance with another exemplary embodiment differs in the following aspects as compared to the multilayer printed wiring board described above.

Namely, as opposed to an electroless plating film constituting a conductor circuit and a via conductor being an electroless copper plating film when it comes to a multilayer printed wiring board in, a multilayer printed wiring board in accordance with this exemplary embodiment differs in that an electroless plating film is an electroless nickel plating film. Namely, a conductor circuit is comprised of an electroless nickel plating film and an electrolytic copper plating film on the electroless nickel plating film, and an electroless plating film formed on the inner wall faces of the opening portions in an interlaminar resin insulating layer constituting a via conductor is an electroless nickel plating film. Further, a multilayer printed wiring board is provided with an electroless nickel plating film in lieu of an electroless copper plating film in a multilayer printed wiring board.

The above-described constitution provided with the conductor circuits and the via conductors of a multilayer printed wiring board is suitable for the formation of fine conductor circuits. This is because a selective etchant whereby nickel is etched but copper is substantially not etched in the removal of unnecessary electroless nickel plating films when independent conductor circuits and via conductors are formed in the manufacture process of a multilayer printed wiring board can be used. Doing so allows the configuration of the electrolytic copper plating film to be fine in advance as the electrolytic copper plating film is not removed by etching. Namely, it is suited for the formation of fine conductor circuits.

Next, a method of manufacturing a multilayer printed wiring board pertaining to this exemplary embodiment will be described in the order of steps.

(101) Likewise as with steps (1) and (2) described above, an interlaminar resin insulating layer is formed on an insulating substrate on which conductor circuits are formed, and opening portions reaching the conductor circuits on the above-described insulating substrate are formed in this interlaminar resin insulating layer.

(102) Next, an electroless nickel plating film is formed on the surface of the above-described interlaminar resin insulating layer (including the wall faces of the above-described opening portions).

At this juncture, an electroless nickel plating film is not formed on the exposed faces of the conductor circuits of the above-described insulating substrate exposed by the above-described openings.

Specifically, a palladium catalyst is first applied such that the above-described palladium catalyst is adhered to the above-described interlaminar resin insulating layer (including the wall faces of the above-described opening portions) and the above-described palladium catalyst is not adhered to the exposed faces of the above-described conductor circuits. Then, an electroless nickel plating is undertaken to form an electroless nickel plating film only on the predetermined portions.

As for a method for selectively adhering the above-described palladium catalyst to the surface of the above-described interlaminar resin insulating layer (including the wall faces of the above-described opening portions), a method similar to the embodiments described above can be used.

Additionally, the thickness of the above-described electroless nickel plating film is preferably 0.1 to 2.0 μm. And, prior to the formation of the above-described electroless nickel plating film, the surface of the interlaminar resin insulating layer may be pre-roughened.

(103) Next, with the use of a method similar to steps (4) and (5), a plating resist is formed on the above-described electroless nickel plating film, and, further, an electrolytic copper plating film is formed on the portion on which a plating resist is not formed on the above-described electroless nickel plating film and on the exposed faces of the above-described conductor circuits. Then, with the use of a method similar to step (6), the plating resist is stripped.

(104) Next, an electroless nickel plating film exposed by the above-described plating resist having been stripped is removed. Here, the electroless nickel plating film is removed preferably with the use of an etchant capable of selectively etching nickel. The etching with the use of such an etchant allows only an unnecessary electroless nickel plating film exposed by the plating resist having been stripped to be selectively etched. And, with respect to such an etchant, since the electrolytic copper plating film is not substantially etched, it is not necessary to have the electrolytic copper plating film designed beforehand larger than the design value of the conductor circuit. As a result thereof, it can suitably be formed even when it is a fine conductor circuit. As for an etchant capable of selectively etching the above-described nickel, MEC Remover NH-1865, made by MEC Company Ltd., etc., for example, may be utilized.

By undertaking such steps as (102) through (104), conductor circuits can be formed on an interlaminar resin insulating layer and via conductors connecting these conductor circuits and conductor circuits on an insulating substrate can concurrently be formed. Additionally, the connection between the conductor circuits on the insulating substrate and the via conductors is a connection between electrolytic copper plating films.

Further, in steps (101) through (104) described above, the insulating substrate corresponds to a first interlaminar resin insulating layer. And, after the above-described conductor circuits have been formed, the catalyst on the interlaminar resin insulating layer may be removed, as necessary, with the use of an acid or an oxidizer. This can prevent the electrical property from declining.

(105) Further, with the repetition of step (2) and of steps (102) through (104) described above as is necessary, the interlaminar resin insulating layer and the conductor circuits may be formed and at the same time the via conductors may be formed. In addition, when step (105) is undertaken, the interlaminar resin insulating layer formed corresponds to a second interlaminar resin insulating layer.

(106) Lastly, with the use of a method similar to step (9) described previously, a solder resist layer and solder bumps can be formed to complete a multilayer printed wiring board.

A multilayer printed wiring board and a method of manufacturing a multilayer printed wiring board pertaining to the present exemplary embodiment can have actions and effects similar to the exemplary embodiment described previously. Additionally, when it comes to the present method of manufacturing a multilayer printed wiring board, fine conductor circuits can suitably be formed since the electroless nickel plating film between electroplating films can be removed with the use of an etchant capable of selectively etching nickel.

The present exemplary embodiment is further described in detail while examples thereof are cited, and the exemplary embodiments are not limited to these examples.

EXAMPLE 2

A multilayer printed wiring board was manufactured likewise as with Example 1, except that an electroless nickel plating film in lieu of an electroless copper plating film was formed with the method described below during step (12) under the manufacture of a multilayer printed wiring board under Example 1, B, and, further, that an etchant (made by MEC Company Ltd., NP1865) capable of selectively etching nickel in lieu of a mixture solution of sulfuric acid and hydrogen peroxide was used during step (15) under the manufacture of a multilayer printed wiring board under Example 1, B.

As to the formation of the above-described electroless nickel plating film, a 1 μm electroless nickel plating film was formed by the substrate to which a palladium catalyst was adhered being immersed in a 90° C. nickel boron bath (made by Uemura Industries Co., Ltd., KLPVERI) for 4 minutes. Additionally, the minimum value of the L/S ratio (line/space ratio) of the conductor circuits 14 was set to be 8 μm/8 μm.

When it comes to the embodiments which have already been described, an electroless copper plating film or an electroless nickel plating film is employed as an electroless plating film formed on the surface of the interlaminar resin insulating layer (including the inner wall faces of the opening portions 16). However, in terms of the exemplary embodiments, the above-described electroless plating film is not limited to a film comprised of copper or nickel, and it can be an electroless plating film, etc., comprised of copper, nickel, palladium, cobalt, tin, or an alloy comprised thereof. Further, the above-describe electroless film is preferably an electroless copper plating film or electroless nickel film. In particular, when the electroless plating film is an electroless nickel plating film and the electroplating film is an electrolytic copper plating film, a fine conductor circuit having a low L/S ratio (line/space ratio) can particularly be suitably manufactured with the selection of an etchant selectively etching nickel, as already described.

When these electroless plating films are formed, the use of an etchant selectively etching electroless plating films is preferable when the unnecessary portions of the above-described electroless plating films (the portions exposed by a plating resist being stripped) are etched, as in the above-described method of manufacturing a multilayer printed wiring board.

As for an etchant selectively etching the above-described electroless palladium plating film, Melstrip PD-3110 made by Meltex, Inc., etc., for example, may be utilized, and as for an etchant selectively etching the above-described electroless tin plating film, MEC Remover S-1818A/S-1818B made by MEC Co., Ltd., etc., for example, may be utilized.

When the above-described interlaminar resin insulating layer is formed with the use of a thermosetting resin, epoxy resin, phenol resin, polyimide resin, polyester resin, bismalaimide resin, polyolefin group resin, polyphenylene ether resin, polyphenylene resin, fluorine resin, etc., for example, may be utilized for the thermosetting resin. Additionally, when the above-described interlaminar resin insulating layer is formed with the use of a photosensitive resin, acrylic resin, etc., for example, may be utilized for the photosensitive resin. Further, when the opening portions in the above-described interlaminar resin insulating layer are formed with laser treatment, a carbon dioxide gas laser, an ultraviolet ray laser, an excimer laser, etc., may be used for the laser. In addition, after the formation of the opening portions, they may be subjected to the desmear treatment as necessary.

Regarding step (8) and step (105), when further conductor circuits and interlaminar resin insulating layers are formed, the number of the repetition thereof is not limited, and it may be twice or more. And, when it comes to a method of manufacturing a multilayer printed wiring board pertaining to the exemplary embodiments, while the total number of interlaminar resin insulating layers is the same for both sides of the insulating substrate, the total numbers may vary from one side to the other of the insulating substrate.

Obviously, numerous modifications and variations of the present invention are possible in light of the above teachings. It is therefore to be understood that within the scope of the appended claims, the invention may be practiced otherwise than as specifically described herein.

What is claimed is:

1. A multilayer printed wiring board, comprising: a first interlaminar resin insulating layer; a first conductor circuit formed on the first interlaminar resin insulating layer; a second interlaminar resin insulating layer formed on the first interlaminar resin insulating layer and the first conductor circuit and having an opening portion exposing a portion of the first conductor circuit;
   a second conductor circuit formed on the second interlaminar resin insulating layer and comprising an electroless plating film formed on a surface of the second interlaminar resin insulating layer and an electrolytic plating film formed on the electroless plating film; and
   a via conductor formed in the opening portion of the second interlaminar resin insulating layer and configured to electrically connect the first conductor circuit and the second conductor circuit,
   wherein the surface of the second interlaminar resin insulating layer is treated with a catalyst which facilitates formation of the electroless plating film, the opening portion of the second interlaminar resin insulating layer has an inner wall face treated with the catalyst, and the via conductor comprises the electroless plating film formed on the inner wall face of the opening portion of the second interlaminar resin insulating layer but not formed to cover the portion of the first conductor circuit exposed by the opening portion, and the electrolytic plating film formed on the electroless plating film and on the portion of the first conductor circuit exposed by the opening portion of the second interlaminar resin insulating layer such that the electrolytic plating film is connected to the portion of the first conductor circuit exposed by the opening portion of the second interlaminar resin insulating layer; wherein the portion of the first conductor circuit exposed by the opening portion of the second interlaminar resin insulating layer is another electrolytic plating film such that the electrolytic plated film of the second conductor circuit is directly connected to the another electrolytic plated film; wherein the first conductor circuit comprises an electroless plating film having an electrolytic plated film formed thereon and including the another electrolytic plated film.

2. The multilayer printed wiring board as set forth in claim 1, wherein the electrolytic plating film is comprised of copper.

3. The multilayer printed wiring board as set forth in claim 1, further comprising:
   an insulating substrate on which the first interlaminar resin insulating layer is formed, wherein the insulating substrate includes a through-hole.

4. The multilayer printed wiring board as set forth in claim 1, further comprising:
   a solder resist layer formed on the second interlaminar resin insulating layer.

5. The multilayer printed wiring board as set forth in claim 1, wherein the catalyst is a palladium catalyst.

6. The multilayer printed wiring board as set forth in claim 1, wherein the catalyst is a palladium catalyst, and the electroless plating film is a copper film.

7. The multilayer printed wiring board as set forth in claim 2, wherein the electroless plating film is comprised of nickel.

8. The multilayer printed wiring board as set forth in claim 3, further comprising:
   a through-hole conductor positioned within the through-hole and configured to electrically connect a first side of the multilayer printed wiring board with a second side of the multilayer printed wiring board.

9. The multilayer printed wiring board as set forth in claim 4, further comprising:
   a solder pad positioned on the second conductor circuit; and
   a solder bump formed on the solder pad and configured to extend outwardly from the solder resist layer.

10. The multilayer printed wiring board as set forth in claim 6, wherein the electrolytic plating film plating film is a copper film.

11. The multilayer printed wiring board as set forth in claim 8, further comprising:
   a resin filler layer provided inside the through-hole conductor.

* * * * *

UNITED STATES PATENT AND TRADEMARK OFFICE
CERTIFICATE OF CORRECTION

| | |
|---|---|
| PATENT NO. | : 8,314,348 B2 |
| APPLICATION NO. | : 12/333398 |
| DATED | : November 20, 2012 |
| INVENTOR(S) | : Toru Nakai et al. |

It is certified that error appears in the above-identified patent and that said Letters Patent is hereby corrected as shown below:

Column 18, line 48 (Claim 10), change "wherein the electrolytic plating film plating film is" to --wherein the electrolytic plating film is--.

Signed and Sealed this
Twelfth Day of March, 2013

Teresa Stanek Rea
*Acting Director of the United States Patent and Trademark Office*